United States Patent
Scatamacchia et al.

(10) Patent No.: US 12,537,483 B2
(45) Date of Patent: Jan. 27, 2026

(54) AMPLIFIER DEVICE WITH LOW FREQUENCY RESONANCE DECOUPLING CIRCUITRY

(71) Applicant: NXP USA, Inc., Austin, TX (US)

(72) Inventors: Damien Scatamacchia, Toulouse (FR); Olivier Lembeye, Saint Lys (FR); Yuanyuan Dong, Plaisance du Touch (FR)

(73) Assignee: NXP USA, Inc., Austin, TX (US)

( * ) Notice: Subject to any disclaimer, the term of this patent is extended or adjusted under 35 U.S.C. 154(b) by 504 days.

(21) Appl. No.: 18/150,351

(22) Filed: Jan. 5, 2023

(65) Prior Publication Data

US 2024/0162862 A1    May 16, 2024

(30) Foreign Application Priority Data

Nov. 15, 2022   (EP) .................................. 22306677

(51) Int. Cl.
| | | |
|---|---|---|
| *H03F 1/02* | (2006.01) | |
| *H03F 1/56* | (2006.01) | |
| *H03F 3/21* | (2006.01) | |

(52) U.S. Cl.
CPC ............ *H03F 1/0288* (2013.01); *H03F 1/56* (2013.01); *H03F 3/211* (2013.01); *H03F 2200/387* (2013.01); *H03F 2200/451* (2013.01)

(58) Field of Classification Search
CPC .......... H03F 1/0288; H03F 1/56; H03F 3/211; H03F 2200/387; H03F 2200/451
USPC ...................................................... 330/295
See application file for complete search history.

(56) References Cited

U.S. PATENT DOCUMENTS

| | | | |
|---|---|---|---|
| 2015/0002229 A1 | 1/2015 | Kuo et al. | |
| 2016/0285503 A1* | 9/2016 | Poulin | H04B 1/44 |
| 2021/0203278 A1* | 7/2021 | Wei | H01L 24/85 |
| 2021/0391829 A1* | 12/2021 | Srinidhi Embar | H03F 3/245 |
| 2022/0392857 A1* | 12/2022 | Rice | H03F 1/0288 |

FOREIGN PATENT DOCUMENTS

EP       2879174 A1      6/2015

OTHER PUBLICATIONS

Unkowned Authors—PXAE213708NB—"Thermally-Enhanced High Power RF LDMOS FET 400 W, 28 V, 2110-2200 MHz" 4600 Silicon Drive—Durham, NC 27703—www.wolfspeed.com, Rev. 03, Mar. 11, 2019, 8 pages.

* cited by examiner

*Primary Examiner* — Hafizur Rahman
(74) *Attorney, Agent, or Firm* — Andrew C. Milhollin (57) ABSTRACT

An amplifier device, such as a Doherty amplifier device, may include an extra lead and decoupling capacitor coupled to radio frequency (RF) cold points of output impedance matching circuitry of multiple amplification paths, such as a carrier path and peaking path, of the amplifier device. The extra lead and the decoupling capacitor are configured to provide low frequency resonance decoupling for the multiple amplification paths. A drain bias voltage may be provided to the drain terminals of transistors of amplifiers of the amplifier device via the extra lead. An integrated passive device (IPD) including a wire fence and one or more conductive pads may be disposed between a carrier amplifier die and a peaking amplifier. The extra lead may be coupled to the RF cold points via the IPD. The wire fence may mitigate RF interference between the carrier amplifier die and the peaking amplifier die.

16 Claims, 7 Drawing Sheets

AMPLIFIER DEVICE WITH LOW FREQUENCY RESONANCE DECOUPLING CIRCUITRY

CROSS-REFERENCE TO RELATED APPLICATIONS

This application claims the priority under 35 U.S.C. § 119 of European patent application no. 22306677.0, filed Nov. 15, 2022, the contents of which are incorporated by reference herein.

TECHNICAL FIELD

Embodiments of the subject matter described herein relate generally to RF amplifier devices and more specifically to RF amplifier packages having extra leads for low frequency resonance decoupling.

BACKGROUND

Radio frequency (RF) amplifiers are typically used to receive RF signals, amplify the RF signals, and provide the amplified RF signals at an output. RF amplifier circuits commonly include internal envelope decoupling circuits configured to decouple lower frequency components of the RF signals at the input or output of the RF amplifier circuit. RF amplifier packages sometimes use multiple extra leads to provide connections to additional decoupling capacitors configured to further mitigate such low frequency components. However, a given conventional RF amplifier package that includes multiple amplifiers requires multiple extra leads to couple amplifier outputs to corresponding decoupling capacitors, resulting in an undesirably larger form factor.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an amplifier device may include a first amplification path that includes first impedance matching circuitry, a second amplification path that includes second impedance matching circuitry, a decoupling capacitor coupled to a reference potential, where the decoupling capacitor is configured to decouple low frequency resonances, and a conductive lead, where the decoupling capacitor is coupled to each of the first impedance matching circuitry and the second impedance matching circuitry via the conductive lead.

In one or more embodiments, the decoupling capacitor may be configured to decouple low frequency resonances in a frequency range of 10 MHz to 100 MHz.

In one or more embodiments, the conductive lead may be coupled to a first RF cold point node of the first impedance matching circuitry and to a second RF cold point node of the second impedance matching circuitry.

In one or more embodiments, the amplifier device may include a first input lead in the first amplification path configured to receive a first input signal, a second input lead in the second amplification path configured to receive a second input signal, a first output lead in the first amplification path configured to provide a first output signal, a second output lead in the second amplification path configured to provide a second output signal, a first amplifier die coupled between the first input lead and the first output lead, and a second amplifier die coupled between the second input lead and the second output lead.

In one or more embodiments, the conductive lead may be disposed between the first output lead and the second output lead.

In one or more embodiments, the conductive lead is disposed between the first input lead and the second input lead.

In one or more embodiments, the amplifier device may include a voltage supply coupled to the conductive lead. The voltage supply may be configured to supply a bias voltage to transistors of each of the first amplifier die and the second amplifier die.

In one or more embodiments, the amplifier device may include an integrated passive device (IPD) disposed between the first amplifier die and the second amplifier die. The IPD may include at least one conductive pad and a wire fence. The conductive lead may be coupled to the first impedance matching circuitry and the second impedance matching circuitry via the at least one conductive pad. The wire fence may be coupled to the at least one conductive pad and may include multiple wire bond loops. The wire fence may be configured to mitigate RF interference between the first amplifier die and the second amplifier die.

In one or more embodiments, the amplifier device may include a first output IPD coupled between the first amplifier die and the first output lead, the first output IPD comprising the first impedance matching circuitry, and a second output IPD coupled between the second amplifier die and the second output lead, the second output IPD comprising the second impedance matching circuitry.

In one or more embodiments, the amplifier device may include a first wire bond coupled directly between the conductive lead and the first output IPD, and a second wire bond coupled directly between the conductive lead and the second output IPD.

In an example embodiment, a Doherty amplifier device may include a carrier amplification path that includes first impedance matching circuitry, a peaking amplification path that includes second impedance matching circuitry, a conductive lead coupled to a first RF cold point of the first impedance matching circuitry and to a second RF cold point of the second impedance matching circuitry, and a decoupling capacitor coupled between the conductive lead and a reference potential. The decoupling capacitor may be configured to decouple low frequency resonances.

In one or more embodiments, the decoupling capacitor may be configured to decouple low frequency resonances in a frequency range of 10 MHz to 100 MHz.

In one or more embodiments, the decoupling capacitor has a capacitance of between 1 µF and 10 µF.

In one or more embodiments, the Doherty amplifier device may include a carrier input lead in the carrier amplification path configured to receive a carrier input signal, a peaking input lead in the peaking amplification path configured to receive a peaking input signal, a carrier output lead in the carrier amplification path configured to provide a carrier output signal, a peaking output lead in the peaking amplification path configured to provide a peaking output signal, a carrier amplifier die coupled between the carrier input lead and the carrier output lead, and a peaking amplifier die coupled between the peaking input lead and the peaking output lead.

In one or more embodiments, the conductive lead is disposed between the carrier output lead and the peaking output lead.

In one or more embodiments, the conductive lead is disposed between the carrier input lead and the peaking input lead.

In one or more embodiments, the Doherty amplifier device may include a voltage supply coupled to the conductive lead. The voltage supply may be configured to supply a bias voltage to transistors of each of the carrier amplifier die and the peaking amplifier die.

In one or more embodiments, the Doherty amplifier device may include an integrated passive device (IPD) disposed between the carrier amplifier die and the peaking amplifier die. The IPD may include at least one conductive pad and a wire fence. The conductive lead may be coupled to the first impedance matching circuitry and the second impedance matching circuitry via the at least one conductive pad. The wire fence may be coupled to the at least one conductive pad and may include multiple wire bond loops. The wire fence may be configured to mitigate RF interference between the carrier amplifier die and the peaking amplifier die.

In one or more embodiments, the Doherty amplifier device may include a carrier output IPD coupled between the carrier amplifier die and the carrier output lead, the carrier output IPD comprising the first impedance matching circuitry, and a peaking output IPD coupled between the peaking amplifier die and the peaking output lead, the peaking output IPD comprising the second impedance matching circuitry.

In one or more embodiments, the Doherty amplifier device may include a first wire bond coupled directly between the conductive lead and the carrier output IPD, and a second wire bond coupled directly between the conductive lead and the peaking output IPD.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

As described herein, a radio frequency (RF) amplifier device having multiple amplification paths, such as a Doherty amplifier, may include output matching circuits having low frequency resonance decoupling circuitry (e.g., in the form of a capacitor coupled between an RF cold point of the output matching circuitry and ground or another reference potential). The low frequency resonance decoupling circuitry may be implemented using a single extra lead coupled between a low frequency resonance decoupling capacitor and the RF cold points of the output matching circuits of each amplification path (e.g., a carrier amplification path and a peaking amplification path, in the case of a Doherty amplifier). According to various embodiments, the extra lead of the low frequency resonance decoupling circuitry may be disposed between output leads of the RF amplifier package or between input leads of the RF amplifier package. Conventionally, separate low frequency resonance decoupling circuitry is implemented using multiple separate extra leads and decoupling capacitors, one for each amplification path. However, such an arrangement undesirably requires more space than those of the present embodiments in which a single extra lead and corresponding decoupling capacitor are used to implement low frequency resonance decoupling circuitry to be shared between multiple amplifier paths.

In one or more embodiments, the drain bias voltage (VDS) of the RF amplifier device may be supplied through the extra lead to respective drains of amplifying transistors of each amplification path of the RF amplifier device, which may reduce the dimensions of the RF amplifier device. For example, a bond pad biased to VDS may be coupled to the extra lead via one or more wire bonds or conductive traces, and the extra lead may be coupled to the drains of the transistors of each of the carrier amplifier and the peaking amplifier of the RF amplifier device through respective output IPDs coupled thereto. Conventionally, RF amplifier devices utilize separate traces running alongside the amplifier paths to supply the VDS to the drains of the amplifying transistors, which undesirably increases the dimensions of the RF amplifier device. By supplying VDS to the drains of amplifying transistors of the RF amplifier device through the extra lead, in accordance with one or more embodiments described herein, dimensions of the RF amplifier device may be reduced compared to such conventional RF amplifier devices.

In one or more embodiments, the extra lead that is coupled to the low frequency resonance decoupling capacitor may be coupled to integrated passive device dies (referred to herein as "IPDs") of the RF amplifier device (e.g., one coupled along each of the carrier path and the peaking path) via one or more wire bonds. In one or more other embodiments, the extra lead may instead be coupled (e.g., via one or more wire bonds) to an intermediary IPD disposed between a carrier amplifier die and a peaking amplifier die of the RF amplifier device. The intermediary IPD may be coupled to output IPDs (each coupled along the carrier path and peaking path, respectively), such that the intermediary IPD couples the extra lead to output matching circuitry implemented on the output IPDs. In such embodiments, the intermediary IPD may include a wire fence comprising loops of wire bonds arranged to mitigate RF interference between the carrier amplification path and the peaking amplification path.

Figure 1:
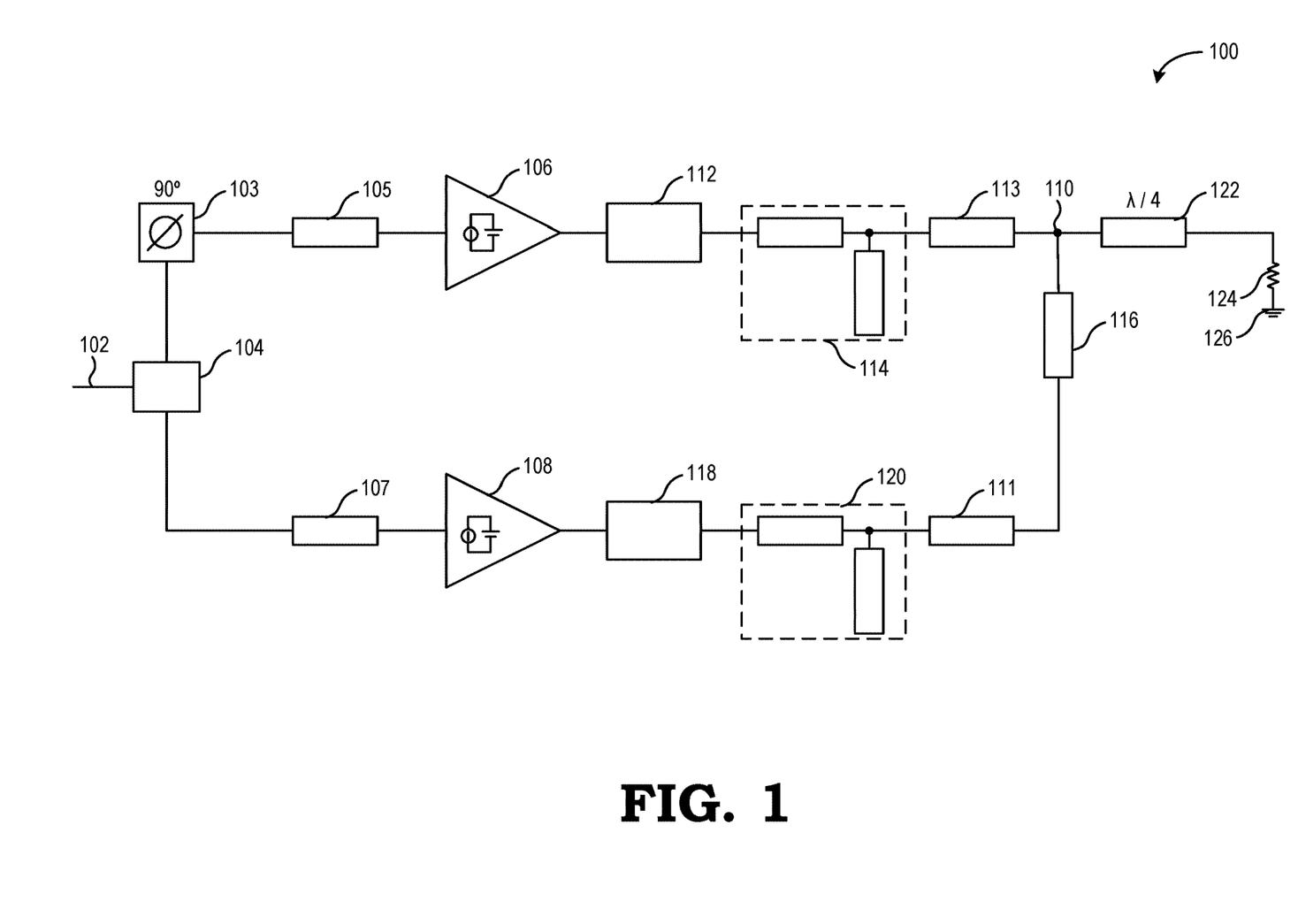
FIG. 1 is a block diagram of an example Doherty radio frequency (RF) amplifier according to an embodiment.

FIG. 1 is a block diagram illustrating a Doherty amplifier architecture (e.g., corresponding to an inverted Doherty amplifier). As illustrated, a Doherty amplifier device 100 may include, at an input 102, a splitter 104. The splitter 104 may include a power divider with an input for receiving an input radio frequency (RF) signal, and first and second divider outputs. For embodiments in which the Doherty amplifier device 100 is a symmetrical Doherty amplifier, the splitter 104 may divide or split an input signal received at input 102 into two signals that are similar with, in some embodiments, equal power or substantially equal power (e.g., each having power within around 10% of the power of the other). In other cases, however, splitter 104 may output signals having unequal power. The splitter 104 may also apply a relative phase shift between first and second signals output from the splitter 104. For example, the splitter 104 may provide about a 90-degree relative phase delay to each of the RF signals output to the carrier path. This phase shift is represented by a phase shifter 103 in the present example.

The outputs of the splitter 104 are coupled to a carrier amplifier 106 and a peaking amplifier 108 through input matching networks 105 and 107 (e.g., input impedance matching networks), respectively. According to various embodiments, the carrier amplifier 106 and the peaking amplifier 108 each may include a respective single transistor or, alternatively, may include a respective system of components including multiple transistors. The carrier amplifier 106 and the peaking amplifier 108 may each include one or more stages of relatively low power level amplification and relatively high power level amplification. In some embodiments, carrier amplifier 106 may be implemented by a network of electrical components, in which case, carrier amplifier 106 may include an active device, which is often modeled as a current source (depicted here as a current source within the carrier amplifier 106). The peaking amplifier 108 may be similarly implemented.

In one or more embodiments, the RF signal provided to the carrier amplifier 106 (i.e., the "carrier input signal") and the RF signal provided to the peaking amplifier 108 (i.e., the "peaking input signal") may be respectively modulated at a predefined frequency. In one or more embodiments, the frequencies of the carrier input signal and the peaking input signal may each be in the range of 500 MHz to 7,500 MHz. According to various examples, the frequencies of the carrier input signal and the peaking input signal may each be in the range of 1,800 MHz-2,200 MHz or in the range of 2,300 MHz-2,700 MHz. In one or more other embodiments, the frequencies of the carrier input signal and the peaking input signal may be at or above 7.7 GHz. The carrier amplifier 106 and the peaking amplifier 108 may each be configured to operate (e.g., amplify received signals) within respective operating frequency ranges that include the frequencies of the carrier input signal and the peaking input signal.

The output of the carrier amplifier 106 may be connected to the output combining node 110 through a carrier output path that includes an output pre-match circuit 112, an output matching network 114, and a delay line element 113. The output of peaking amplifier 108 may be connected to the output combining node 110 through a peaking output path that includes an output pre-match circuit 118, an output matching network 120, and a delay line element 111. In one or more other embodiments, the carrier amplification path may have a phase length (i.e., from the current source to the combining node) of $90°+n*180$ where $n>=0$ (e.g., a 90° phase length for $n=0$, a 270° phase length for $n=1$, and so on) and the peaking amplification path may have a phase length (i.e., from the current source to the combining node) of $m*180°$ where $m>=0$ (e.g., a 0° phase length for $m=0$, a 180° phase length for $m=1$, and so on). In some embodiments, the output pre-match circuits 112 and 118 may include or may be harmonic terminations.

An impedance network, represented by element 122 may be configured to mitigate impedance mismatching that may occur between a load 124 and the combination of the carrier amplifier 106 and the peaking amplifier 108. In some embodiments, the element 122 may be replaced by a suitably configured transmission line or impedance transformer, where the transmission line or impedance transformer has an impedance selected to match or substantially match (e.g., within around 10%) the impedance of Doherty amplifier device 100 to the load 124 over the operating dynamic range of the Doherty amplifier device 100. The load 124 may be coupled between the output combining node 110 and a reference potential 126 (sometimes referred to as "ground 126" or "ground potential 126"), which may correspond to a reference voltage or ground voltage. The carrier amplifier 106 may be considered as a current generator for the pre-match circuit 112 and the output matching network 114. Similarly, the peaking amplifier 108 may be considered as a current generator for the output pre-match circuit 118 and the output matching network 120. The output matching networks 114, 120 may be configured to reduce impedance mismatching between the carrier and peaking amplifiers 106, 108, respectively, and the load 124. The output matching networks 114, 120 may also be configured to filter out noise from the respective RF signals output by the carrier amplifier 106 and the peaking amplifier 108, where such filtration may be performed using one or more low-pass (to ground) and/or band-pass (to ground) filter circuits. In one or more embodiments, an impedance transformer 116 may be interposed in the peaking amplification path between the output of the peaking amplifier 108 and the combining node 110.

In one or more embodiments, the output matching networks 114, 120 may include internal envelope decoupling circuitry (e.g., video bandwidth (VBW) circuitry or enhanced video bandwidth (eVBW) circuitry) coupled between RF cold point nodes of the output matching networks 114, 120 and ground (e.g., the reference potential 126). Such internal envelope decoupling circuitry may be configured to terminate or mitigate low frequency components (e.g., corresponding to envelope frequencies of the corresponding amplifiers) of RF signals at the outputs of the carrier amplifier 106 and the peaking amplifier 108. Termination or mitigation of such low frequency components may be further enhanced by providing additional low frequency resonance decoupling capacitors between the RF cold point nodes and ground.

In one or more other embodiments, the internal envelope decoupling circuitry may instead be coupled to other "RF low impedance points" at the output of the carrier amplifier 106 or peaking amplifier 108 other than an RF cold point. An "RF low impedance point" may refer to points in a circuit or network having low RF signal impedance and may be considered "quasi" RF cold points. An example of such an RF low impedance point may be an intermediate node of a T-network (e.g., the node coupled between the inductors of the T-network and to ground through the capacitor of the T-network) that may be included in either of the output impedance matching networks 114, 120.

Conventionally, such low frequency resonance decoupling capacitors are implemented out-of-package, such that multiple external low frequency resonance decoupling capacitors are coupled to the RF cold point nodes of the amplifiers via respective conductive leads (sometimes referred to herein as "extra leads"). Such conventional packages utilize multiple extra leads and multiple external low frequency resonance decoupling capacitors—at least one for each amplifier of the package. This use of multiple external low frequency resonance decoupling capacitors and associated extra leads in conventional amplifier devices may undesirably increase the size of the amplifier device. In the various embodiments provided herein, in contrast, the output matching networks 114, 120 may implement low frequency resonance decoupling circuitry via a single low frequency resonance decoupling capacitor (sometimes referred to herein as a "decoupling capacitor") coupled to RF cold point nodes of both of the output matching networks 114, 120 via a single extra lead, as described in more detail below. By implementing low frequency resonance decoupling circuitry in the Doherty amplifier device 100 for both the carrier and peaking paths using a single extra lead and a single decoupling capacitor, the dimensions (e.g., "footprint") of the Doherty amplifier 100 may advantageously be reduced.

Figure 2:
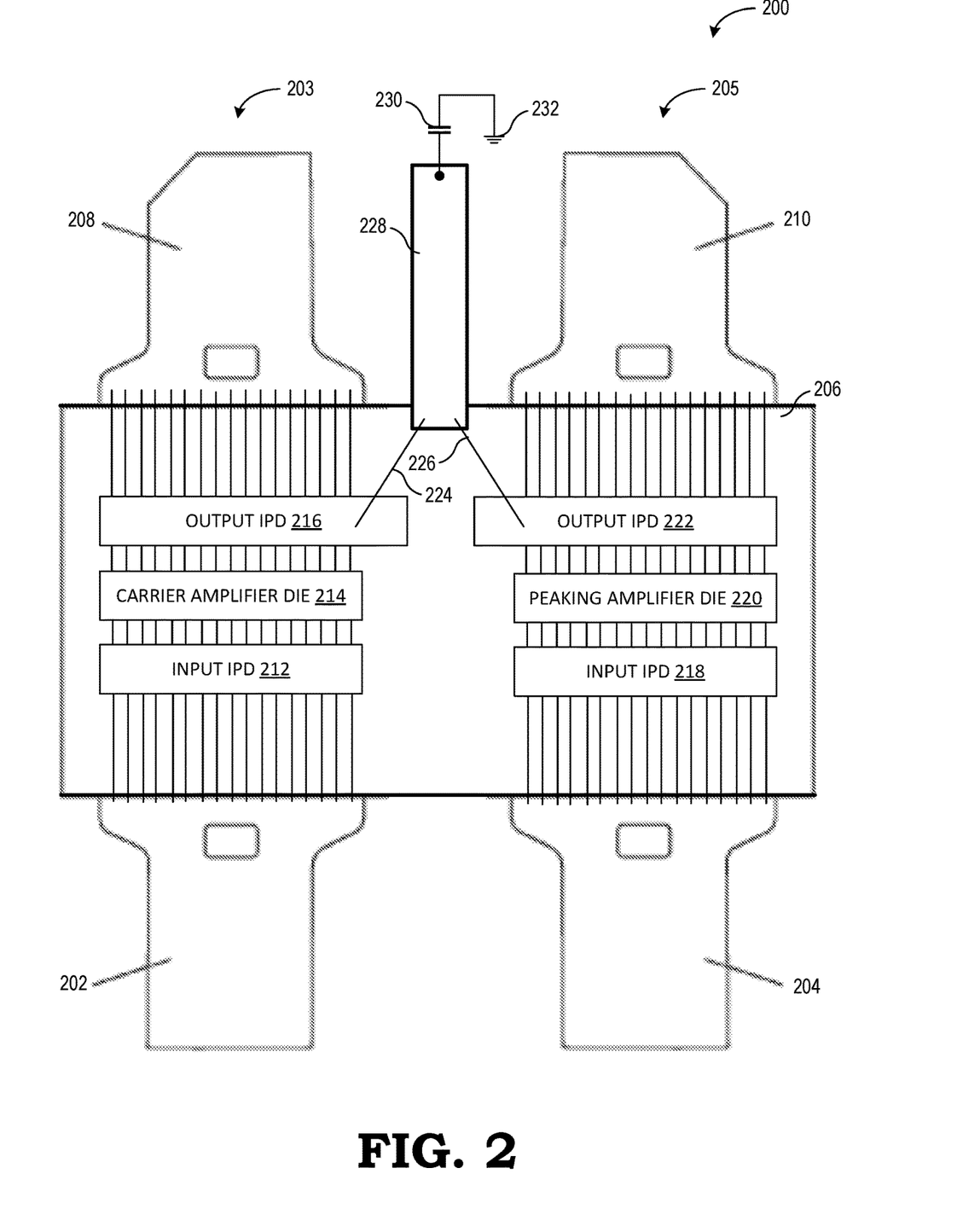
FIG. 2 is a top view of an example device package that includes an RF amplifier, such as the Doherty RF amplifier of FIG. 1, where the device package includes an extra lead disposed between carrier and peaking output leads, according to an embodiment.

FIG. 2 shows a top-down view of an illustrative amplifier package 200 corresponding to a Doherty amplifier device (which may correspond to an example implementation of the Doherty amplifier device 100 shown in FIG. 1) that includes an extra lead 228 disposed between a carrier output lead 208 of a carrier amplification path 203 (sometimes referred to as "carrier path 203") and a peaking output lead 210 of a peaking amplification path 205 (sometimes referred to as "peaking path 205") of the amplifier package 200. The amplifier package 200 may include a carrier path 203, a peaking path 205, a ground-plane substrate 206, and an extra lead 228. The carrier path 203 may include a carrier input lead 202, a carrier input integrated passive die (IPD) 212, a carrier amplifier die 214 (e.g., the carrier amplifier 106 of FIG. 1; sometimes referred to as a "carrier transistor die 214"), a carrier output IPD 216, and a carrier output lead 208. The peaking path 205 may include a peaking input lead 204, a peaking input IPD 218, a peaking amplifier die 220 (e.g., the peaking amplifier 108 of FIG. 1; sometimes referred to as a "peaking transistor die 220"), a peaking output IPD 222, and a peaking output lead 210.

The carrier input lead 202 may include electrically conductive material (e.g., gold, copper, or another applicable conductive material) that is coupled to the carrier input IPD 212. The carrier input lead 202 may be electrically insulated from the ground-plane substrate 206 (e.g., by dielectric material interposed between the carrier input lead 202 and the ground-plane substrate 206). The carrier input IPD 212 may be coupled to the carrier amplifier die 214. The carrier amplifier die 214 may be coupled to the carrier output IPD 216. The carrier output lead 208 may include electrically conductive material (e.g., gold, copper, or another applicable conductive material) that is coupled to the carrier output IPD 216. The carrier output lead 208 may be electrically insulated from the ground-plane substrate 206 (e.g., by dielectric material interposed between the carrier output lead 208 and the ground-plane substrate 206). Connections between elements of the carrier path 203 may be implemented via respective arrays of wire bonds, as shown in the present example.

The peaking input lead 204 may include electrically conductive material (e.g., gold, copper, or another applicable conductive material) that is coupled to the peaking input IPD 218). The peaking input lead 204 may be electrically insulated from the ground-plane substrate 206 (e.g., by dielectric material interposed between the peaking input lead 204 and the ground-plane substrate 206). The peaking input IPD 218 may be coupled to the peaking amplifier die 220. The peaking amplifier die 220 may be coupled to the peaking output IPD 222. The peaking output lead 210 may include electrically conductive material (e.g., gold, copper, or another applicable conductive material) that is coupled to the peaking output IPD 222. The peaking output lead 210 may be electrically insulated from the ground-plane substrate 206 (e.g., by dielectric material interposed between the peaking output lead 210 and the ground-plane substrate 206). Connections between elements of the peaking path 205 may be implemented via respective arrays of wire bonds, as shown in the present example.

The ground-plane substrate 206 may be formed from conductive material (e.g., gold, copper, or another applicable conductive material) of a housing of the amplifier package 200. The carrier input IPD 212, the carrier amplifier die 214, carrier output IPD 216, the peaking input IPD 218, the peaking amplifier die 220, and the peaking output IPD 222 may each be disposed on the ground-plane substrate 206 and may each be electrically coupled to the ground-plane substrate 206. For example, the ground-plane substrate 206 may provide a reference potential, such as a ground potential (e.g., reference potential 126 of FIG. 1), for each of the input IPD 212, the carrier amplifier die 214, and the output IPD 218. Herein the term "potential", such as a reference potential or ground potential, refers to voltage potential unless noted otherwise.

The carrier input lead 202 and the peaking input lead 204 may act as inputs of the amplifier of the amplifier package 200 for receiving carrier signals and peaking signals, respectively, which may be received from a splitter (e.g., the splitter 104 of FIG. 1). The carrier output lead 208 and the peaking output lead 210 may act as respective outputs of the Doherty amplifier of the amplifier package 200. Amplified carrier and peaking signals output via the carrier output lead 208 and the peaking output lead 210 may be combined at a combining node (e.g., the combining node 110 of FIG. 1), to produce an RF output signal, which is then provided to a load (e.g., the load 124 of FIG. 1). The carrier input IPD 212 and the peaking input IPD 218 may include integrated components (e.g., capacitors, resistors, inductors, through-substrate vias (TSVs), and the like) that, in combination with wire bond arrays coupled thereto, form impedance matching circuitry (e.g., of the impedance matching networks 105 and 107 of FIG. 1, respectively). The carrier output IPD 216 and the peaking output IPD 222 may each include integrated components (e.g., capacitors, resistors, inductors, TSVs, and the like) that, together with wire bond arrays coupled thereto, form impedance matching circuitry (e.g., of the output matching networks 114 and 120 of FIG. 1, respectively).

The carrier amplifier die 214 and the peaking amplifier die 220 may each, respectively, include a transistor device, which may include an array of transistors arranged in parallel. Each of the parallel transistors of the carrier amplifier die 214 may include a control terminal (e.g., a gate terminal) coupled to the carrier input lead 202 via the carrier input IPD 212, a first current terminal (e.g., a source terminal) coupled to the ground-plane substrate 206 (e.g., by one or more TSVs formed in the carrier amplifier die 214), and a second current terminal (e.g., a drain terminal) coupled to the carrier output lead 208 via the carrier output IPD 216. Each of the parallel transistors of the peaking amplifier die 220 may include a control terminal (e.g., a gate terminal) coupled to the peaking input lead 204 via the peaking input IPD 218, a first current terminal (e.g., a source terminal) coupled to the ground-plane substrate 206 (e.g., by one or more TSVs formed in the peaking amplifier die 220) and a second current terminal (e.g., a drain terminal) coupled to the peaking output lead 210 via the peaking output IPD 222.

In one or more embodiments, the transistors of either or both of the carrier amplifier die 214 and the peaking amplifier die 220 may be LDMOS FETS. In one or more other embodiments, such transistors may be BJTs, MESFETs, HBTs, or HEMTs. According to various embodiments, the transistors of either or both of the carrier amplifier die 214 and the peaking amplifier die 220 may include silicon (e.g., as with a silicon LDMOS FET or a silicon bipolar transistor), a III-V material such as GaAs (e.g., as with a GaAs MESFET), InGaP (e.g., as with an InGaP HBT), or GaN (e.g., as with a GaN HEMT or GaN bipolar transistor). The carrier input IPD 212, the peaking input IPD 218, the carrier output IPD 216, and the peaking output IPD 222 may each include respective semiconductor (e.g., silicon) die on or in which discrete or bulk impedance elements (e.g., capacitors, inductors, resistors, or the like) may be formed.

The extra lead 228 may be partially disposed over the ground-plane substrate 206 and disposed between the carrier output lead 208 and the peaking output lead 210. For example, the extra lead 228 may include conductive material (e.g., gold, copper, or another applicable conductive material). Dielectric material (not shown) may be disposed between the extra lead 228 and the ground-plane substrate 206 and may provide electrical insulation between the extra lead 228 and the ground-plane substrate 206. The extra lead 228 may be coupled to the carrier output IPD 216 via one or more wire bonds 224, to the peaking output IPD 222 via one or more wire bonds 226, and to a decoupling capacitor 230. For example, the extra lead 228 may be coupled to RF cold points (sometimes referred to as "RF cold point nodes") of impedance matching circuitry implemented on the carrier output IPD 216 and the peaking output IPD 222 (e.g., output matching networks 114 and 120 of FIG. 1, respectively).

Herein, an "RF cold point" refers to a node that may function as a virtual ground reference voltage for RF electrical signals. If the RF cold point were ideal, then during device operation, little or no RF energy (e.g., including at the amplifier's center operating frequency) would be present at the RF cold point. However, in practice, an RF cold point is typically not ideal, and some RF energy is present at the RF cold point during device operation, which may include RF energy from in-package low frequency resonances.

The decoupling capacitor 230 may be coupled between the extra lead 228 and a reference potential 232 (e.g., ground). The extra lead 228 may provide a conductive path from RF cold points at the carrier output IPD 216 and the peaking output IPD 222 to the reference potential 232 through the decoupling capacitor 230. For example, the decoupling capacitor 230 may be configured to decouple in-package circuit low frequency resonances (e.g., resonances in a frequency range of around 10 MHz to around 100 MHz) by providing a relatively low impedance path to the reference potential 232 at corresponding frequencies. In one or more embodiments, the decoupling capacitor 230 may have a capacitance of around 1 µF to around 10 µF.

Conventional amplifier packages with multiple amplification paths (e.g., two amplification paths) typically utilize two or more extra leads for low frequency resonance decoupling. By using a single extra lead 228 to couple the decoupling capacitor 230 to each of the carrier output IPD 216 and the peaking output IPD 222, the dimensions of the Doherty amplifier device (e.g., the Doherty amplifier device 100 of FIG. 1) that includes the amplifier package 200 may be advantageously reduced compared to amplifier devices that include such conventional amplifier packages. By placing the extra lead 228 between the carrier output lead 208 and the peaking output lead 210, as shown in the present example, may further reduce the dimensions of the Doherty amplifier device that includes the amplifier package 200. Similarly, devices in which Doherty amplifier devices are utilized, such as high-power (e.g., over around 300 W) multiple-output radio transmitters, may have advantageously reduced form factors when utilizing amplifier packages having a single extra lead for low frequency resonance decoupling, such as the amplifier package 200, compared to those utilizing conventional amplifier packages with multiple extra leads for low frequency resonance decoupling.

Figure 3:
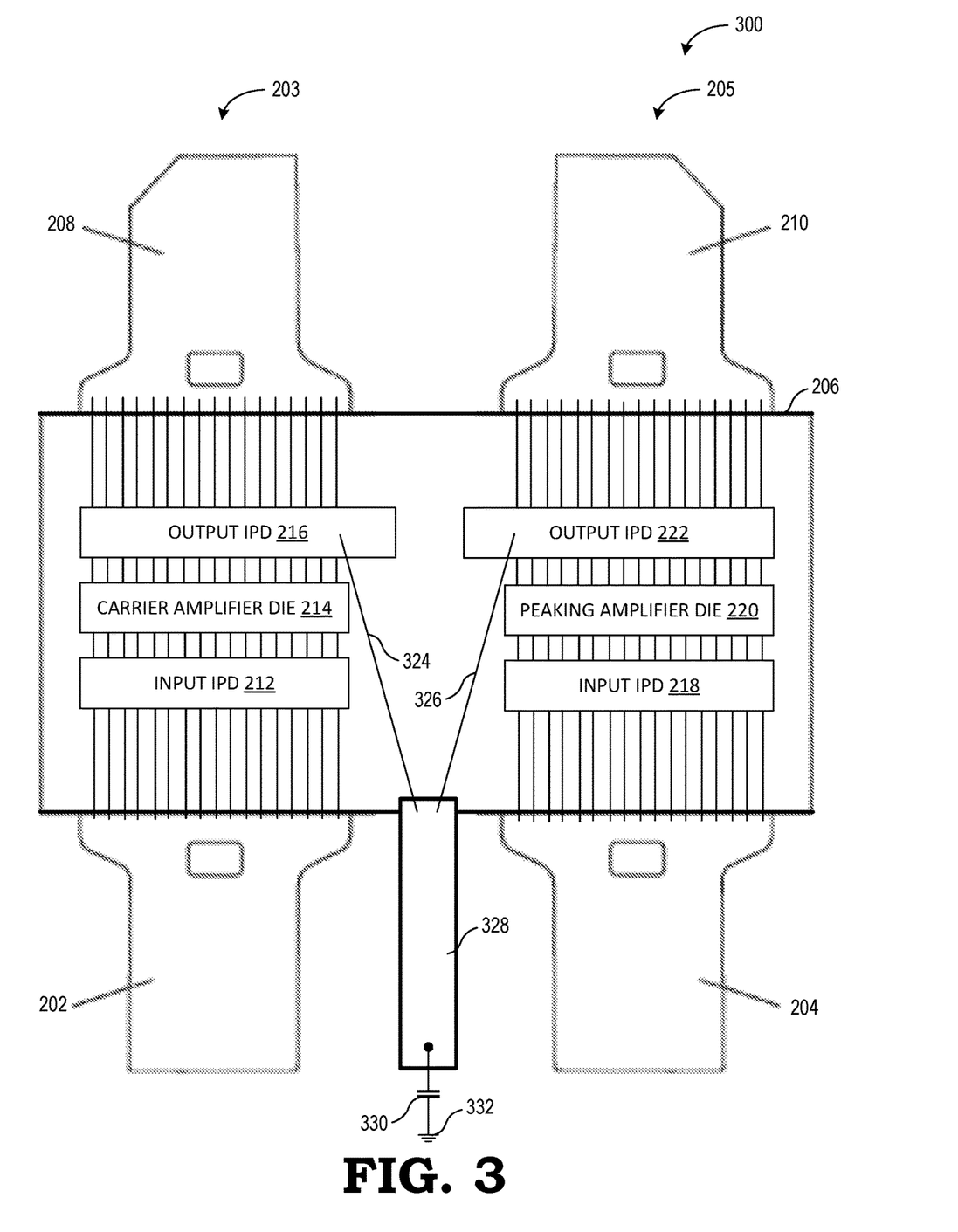
FIG. 3 is a top view of an example device package that includes an RF amplifier, such as the Doherty RF amplifier of FIG. 1, where the device package includes an extra lead disposed between carrier and peaking input leads, according to an embodiment.

FIG. 3 shows a top-down view of an illustrative amplifier package 300 corresponding to a Doherty amplifier device (which may correspond to an example implementation of the Doherty amplifier device 100 shown in FIG. 1) that includes an extra lead 328 disposed between a carrier input lead 202 of a carrier path 203 and a peaking input lead 204 of a peaking path 205 of the amplifier package 300. It should be noted that various features of the amplifier package 300 correspond to those described above in connection with the amplifier package 200 of FIG. 2, with like reference numerals being used here to denote like elements, and descriptions of such features are not repeated here for sake of brevity.

The extra lead 328 may be partially disposed over the ground-plane substrate 206 and disposed between the carrier input lead 202 and the peaking input lead 204. For example, the extra lead 328 may include conductive material (e.g., gold, copper, or another applicable conductive material). Dielectric material (not shown) may be disposed between the extra lead 328 and the ground-plane substrate 206 and may provide electrical insulation between the extra lead 328 and the ground-plane substrate 206. The extra lead 328 may be coupled to the carrier output IPD 216 via one or more wire bonds 224, to the peaking output IPD 222 via one or more wire bonds 226, and to a decoupling capacitor 330. For example, the extra lead 328 may be coupled to RF cold points of impedance matching circuitry implemented on the carrier output IPD 216 and the peaking output IPD 222 (e.g., output matching networks 114 and 120 of FIG. 1, respectively).

The decoupling capacitor 330 may be coupled between the extra lead 328 and a reference potential 332 (e.g., ground). The extra lead 328 may provide a conductive path from RF cold points at the carrier output IPD 216 and the peaking output IPD 222 to the reference potential 332 through the decoupling capacitor 330. For example, the decoupling capacitor 330 may be configured to decouple in-package circuit low frequency resonances (e.g., resonances in a frequency range of around 10 MHz to around 100 MHz) by providing a relatively low impedance path to the reference potential 332 at corresponding frequencies. In one or more embodiments, the decoupling capacitor 330 may have a capacitance of around 1 µF to around 10 µF.

As shown, the respective lengths of the wire bonds 324, 326 that couple the extra lead 328 to the carrier output IPD 216 and the peaking output IPD 222 may be greater than the respective lengths of the wire bonds 224, 226 that couple the extra lead 228 to the carrier output IPD 216 and the peaking output IPD 222 in the amplifier package 200 of FIG. 2. The comparatively greater lengths of the wire bonds 324, 326 may correspond to comparatively higher inductances attributable to the wire bonds 324, 326. In one or more embodiments, the amplifier package 300 may include an in-package low frequency decoupling circuit, such that higher inductances attributable to the comparatively longer wire bonds 324, 326 may have a relatively negligible impact on the frequency-dependent output impedances seen by the carrier amplifier (e.g., implemented on the carrier amplifier die 214) and the peaking amplifier (e.g., implemented on the peaking amplifier die 220) of the amplifier package 300. Thus, positioning the extra lead 328 at the input side of the amplifier package 300, as shown in the present example, may have a relatively negligible impact on performance of the amplifier package 300, which may allow for greater design flexibility for the amplifier package 300 and the corresponding Doherty amplifier device.

By using a single extra lead 328 to couple the decoupling capacitor 330 to each of the carrier output IPD 216 and the peaking output IPD 222, the dimensions of the Doherty amplifier device (e.g., the Doherty amplifier device 100 of FIG. 1) that includes the amplifier package 300 may be advantageously reduced compared to amplifier devices that include conventional amplifier packages that include multiple extra leads for low frequency resonance decoupling. By placing the extra lead 328 between the carrier input lead 202 and the peaking input lead 204, as shown in the present example, may further reduce the dimensions of the Doherty amplifier device that includes the amplifier package 300. Similarly, devices in which Doherty amplifier devices are utilized, such as high-power (e.g., over around 300 W) multiple-output radio transmitters, may have advantageously reduced form factors when utilizing amplifier packages having a single extra lead for low frequency resonance decoupling, such as the amplifier package 300, compared to those utilizing conventional amplifier packages with multiple extra leads for low frequency resonance decoupling.

Figure 4:
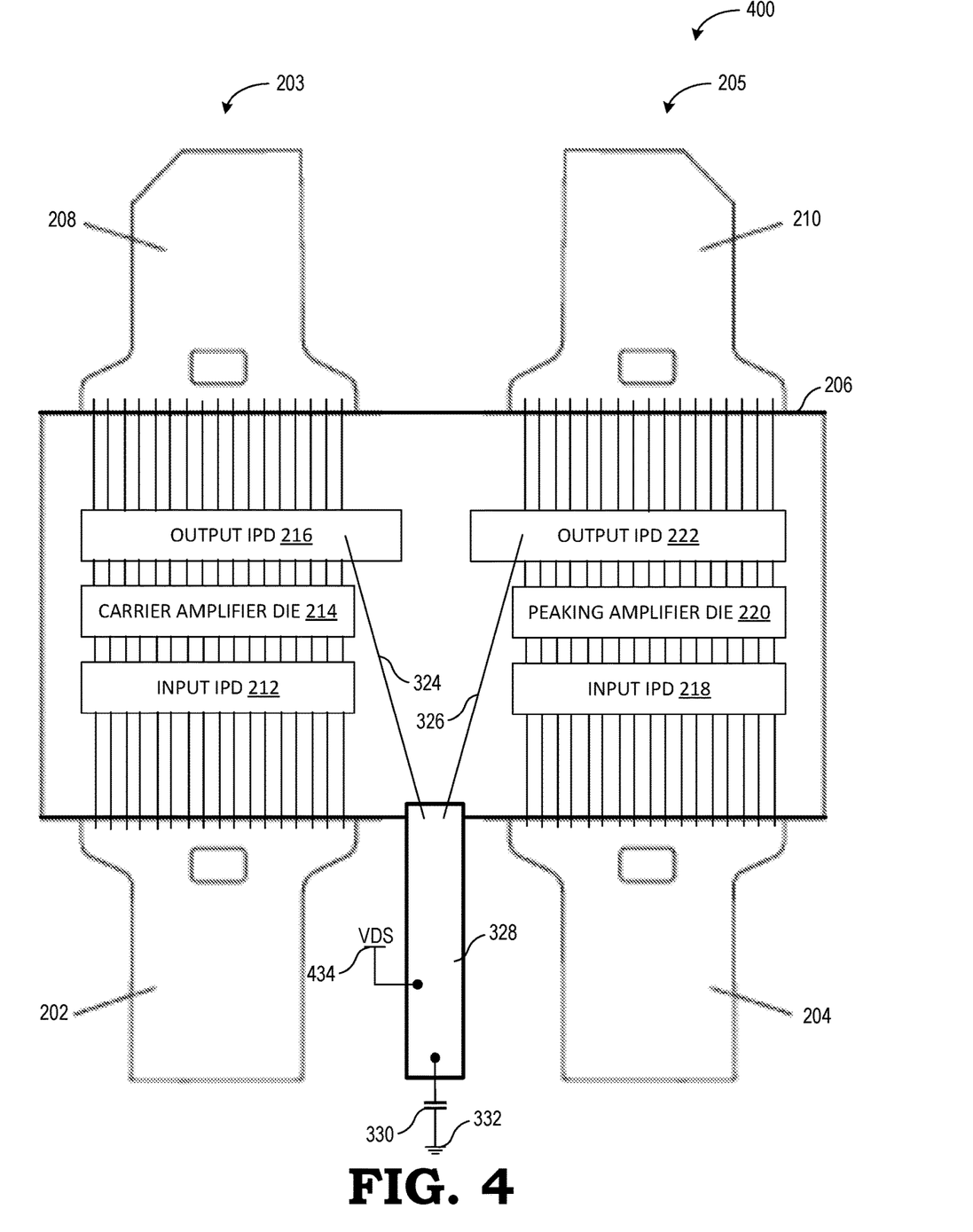
FIG. 4 is a top view of an example device package that includes an RF amplifier, such as the Doherty RF amplifier of FIG. 1, where the device package includes an extra lead disposed between carrier and peaking input leads and the extra lead is coupled to a drain bias voltage, according to an embodiment.

FIG. 4 shows a top-down view of an illustrative amplifier package 400 corresponding to a Doherty amplifier device (which may correspond to an example implementation of the Doherty amplifier device shown in FIG. 1) that includes an extra lead 328 disposed between a carrier input lead 202 of a carrier path 203 and a peaking input lead 204 of a peaking path 205 of the amplifier package 400, where a drain bias voltage VDS is supplied to the extra lead via a drain bias voltage supply 434. It should be noted that various features of the amplifier package 400 correspond to those described above in connection with the amplifier packages 200 and 300 of FIGS. 2 and 3, with like reference numerals being used here to denote like elements, and descriptions of such features are not repeated here for sake of brevity.

In the present example, a drain bias voltage VDS may be supplied at the extra lead 328 via a drain bias voltage supply 434. For example, the drain bias voltage VDS may be supplied by the drain bias voltage supply 434 to drain terminals of transistors of the carrier amplifier die 214 and the peaking amplifier die 220 via the extra lead 328, the carrier output IPD 216, and the peaking output IPD 222. By supplying the drain bias voltage VDS to the drain terminals of transistors of the carrier amplifier die 214 via the extra lead 328, the dimensions of a Doherty amplifier device that includes the amplifier package 400 may be further reduced (e.g., since conductive traces that may otherwise be used to couple the drain bias voltage VDS to the carrier output lead 208 and the peaking output lead 210 may be omitted).

Figure 5:
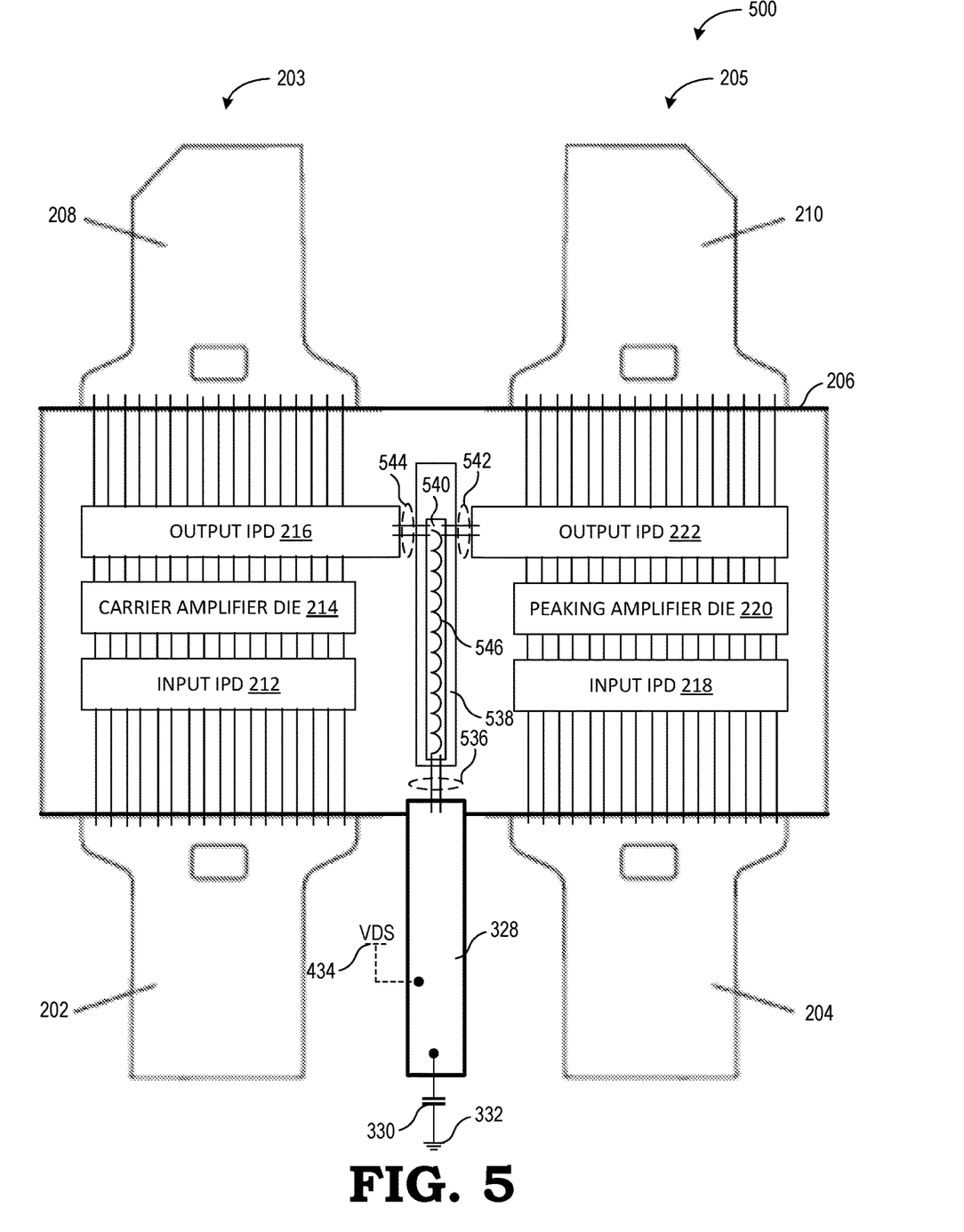
FIG. 5 is a top view of an example device package that includes an RF amplifier, such as the Doherty RF amplifier of FIG. 1, where the device package includes an extra lead disposed between carrier and peaking input leads, and an additional IPD is coupled between the extra lead and each of the carrier and peaking output IPDs, according to an embodiment.

FIG. 5 shows a top-down view of an illustrative amplifier package 500 corresponding to a Doherty amplifier device (which may correspond to an example implementation of the Doherty amplifier device shown in FIG. 1) that includes an extra lead 328 disposed between a carrier input lead 202 of a carrier path 203 and a peaking input lead 204 of a peaking path 205 of the amplifier package 500, where an IPD 538 may be interposed between the extra lead 328 and each of the carrier output IPD 216 and the peaking output IPD 222. It should be noted that various features of the amplifier package 500 correspond to those described above in connection with the amplifier packages 200, 300, and 400 of FIGS. 2, 3, and 4, with like reference numerals being used here to denote like elements, and descriptions of such features are not repeated here for sake of brevity.

The IPD 538 may be disposed over the ground-plane substrate 206. The IPD 538 may include a semiconductor substrate or dielectric substrate on which one or more conductive pads 540 are formed. The extra lead 328 may be coupled to the conductive pad(s) 540 at or near a first end of the IPD 538 via one or more wire bonds 536. The carrier output IPD 216 may be coupled to the conductive pad(s) 540 at or near a second end of the IPD 538 via one or more wire bonds 544. The peaking output IPD 222 may be coupled to the conductive pad(s) 540 at or near the second end of the IPD 538 via one or more wire bonds 542. In this way, each of the carrier output IPD 216 and the peaking output IPD 222 may be coupled to the reference potential 332 via the conductive pad(s) 540 of the IPD 538, the extra lead 328, and the decoupling capacitor 330.

In one or more embodiments, a drain bias voltage VDS may be supplied at the extra lead 328 via a drain bias voltage supply 434, as in the example of FIG. 4. In one or more other embodiments, the drain bias voltage VDS may instead be supplied via conductive traces (disposed outside of the amplifier package 500) coupled to the carrier output lead 208 and the peaking output lead 210.

A wire fence 546 may be disposed on the IPD 538. For example, the wire fence 546 may include multiple loops of wire bonds, each coupled at both ends to the conductive pad(s) 540. In one or more embodiments, the wire fence 546 may include a single row (i.e., array) of wire bond loops that extends along the length of the IPD 538. In one or more other embodiments, the wire fence 546 may include multiple (e.g., two, three, four, or more) rows (i.e., arrays) of wire bond loops, each extending along the length of the IPD 538. In one or more embodiments, the conductive pad(s) 540 may include a single contiguous conductive pad. In one or more other embodiments, the conductive pad(s) 540 may include multiple bond pads electrically coupled together via the wire bonds of the wire fence 546.

The wire fence 546 may be arranged between portions of the carrier path 203 (e.g., including the carrier amplifier die 214) and the peaking path 205 (e.g., including the peaking amplifier die 220), such that the wire fence 546 may mitigate RF interference between the carrier path 203 and the peaking path 205. By mitigating RF interference between the carrier path 203 and the peaking path 205 in this way, the wire fence 546 may advantageously improve performance of the Doherty amplifier device that includes the amplifier package 500.

Figure 6:
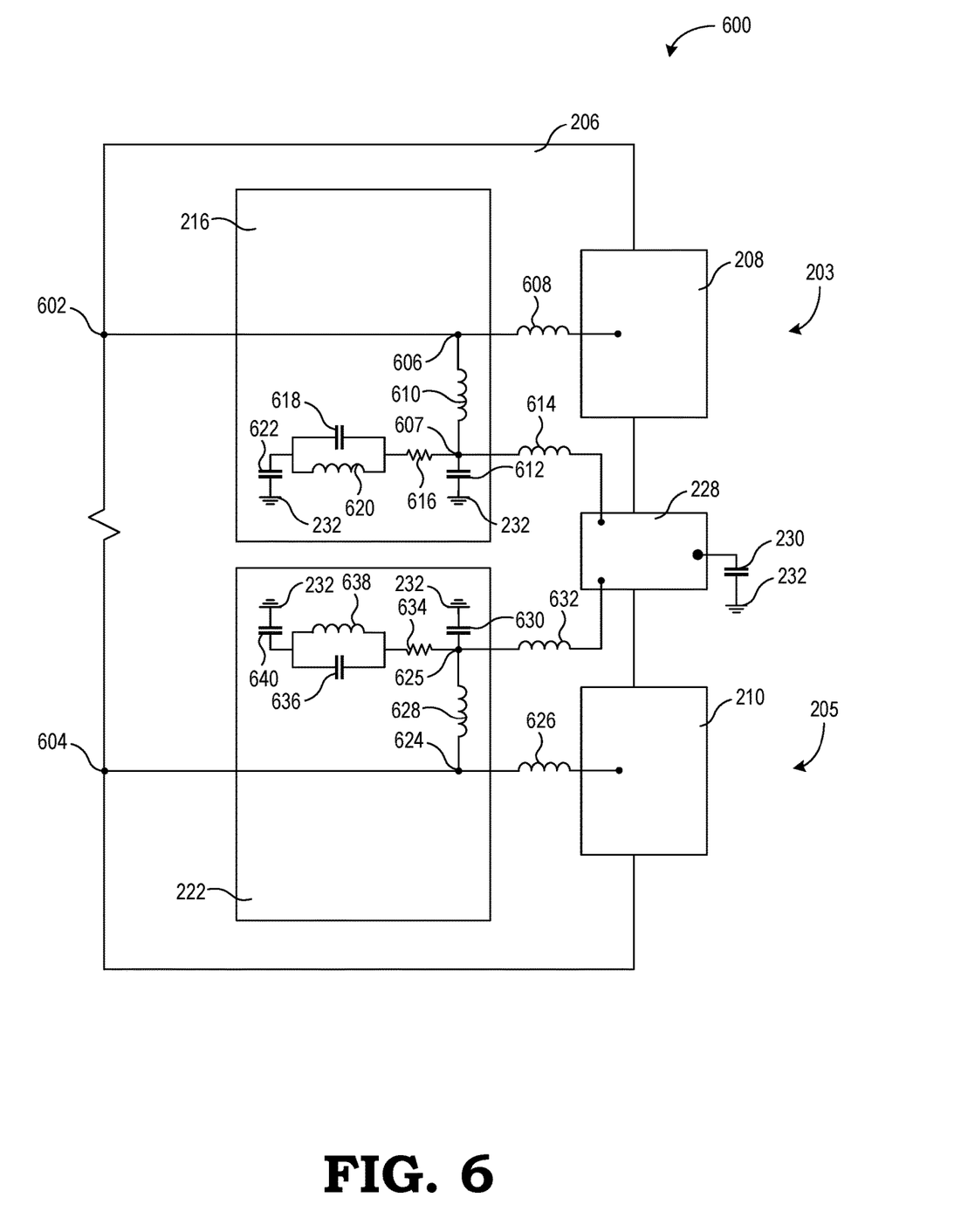
FIG. 6 is a circuit diagram overlaid with a portion of an example device package that includes an RF amplifier, such as the Doherty RF amplifier of FIG. 1, where the device package includes an extra lead disposed between carrier and peaking output leads, according to an embodiment.

FIG. 6 shows a portion of an amplifier package 600, which may correspond to a portion of the amplifier package 200 of FIG. 2, including a circuit diagram corresponding, at least in part, to output impedance matching circuitry (e.g., output matching networks 114 and 120 of FIG. 1) of the amplifier package 600. It should be noted that various features of the amplifier package 600 correspond to those described above in connection with the amplifier package 200 of FIG. 2, with like reference numerals being used here to denote like elements, and descriptions of such features are not repeated here for sake of brevity.

The carrier path 203 may include a node 602 that corresponds to an output of the carrier amplifier die 214 (shown in FIG. 2), the carrier output IPD 216, and the carrier output lead 208. The node 602 is coupled to the carrier output lead 208 via an inductor 608 (e.g., corresponding to the inductance of an array of wire bonds coupled between the carrier output IPD 216 and the carrier output lead 208. Output impedance matching circuitry implemented on the carrier output IPD 216 may be coupled to a node 606 interposed between the node 602 and the inductor 608. The output impedance matching circuitry of the carrier output IPD 216 may include an inductor 610 coupled between the node 606 and an RF cold point node 607, a capacitor 612 coupled between the RF cold point node 607 and the reference potential 232, a resistor 616 coupled to the RF cold point node 607, a capacitor 622 coupled to the reference potential 232, and a parallel LC circuit including a capacitor 618 and an inductor 620 coupled in parallel between the capacitor 622 and the resistor 616. The RF cold point node 607 may be coupled to the extra lead 228 via an inductor 614 (e.g., corresponding to the inductance of the one or more wire bonds 224 shown in FIG. 2). As shown, the low frequency resonance decoupling circuit that includes the extra lead 228 and the decoupling capacitor 230 may be coupled to the RF cold point node 607 via the inductor 614 (e.g., the one or more wire bonds 224 of FIG. 2).

The peaking path 205 may include a node 604 that corresponds to an output of the peaking amplifier die 220 (shown in FIG. 2), the peaking output IPD 222, and the peaking output lead 210. The node 604 is coupled to the peaking output lead 210 via an inductor 626 (e.g., corresponding to the inductance of an array of wire bonds coupled between the peaking output IPD 222 and the peaking output lead 210. Output impedance matching circuitry implemented on the peaking output IPD 222 may be coupled to a node 624 interposed between the node 604 and the inductor 626. The output impedance matching circuitry of the peaking output IPD 222 may include an inductor 628 coupled between the node 606 and an RF cold point node 625, a capacitor 630 coupled between the RF cold point node 625 and the reference potential 232, a resistor 634 coupled to the RF cold point node 607, a capacitor 640 coupled to the reference potential 232, and a parallel LC circuit including a capacitor 636 and an inductor 638 coupled in parallel between the capacitor 640 and the resistor 634. The RF cold point node 607 may be coupled to the extra lead 228 via an inductor 632 (e.g., corresponding to the inductance of the one or more wire bonds 226 shown in FIG. 2). As shown, the low frequency resonance decoupling circuit that includes the extra lead 228 and the decoupling capacitor 230 may be coupled to the RF cold point node 625 via the inductor 632 (e.g., the one or more wire bonds 226 of FIG. 2).

While the present example shows the extra lead 228 disposed between the carrier output lead 208 and the peaking output lead 210, corresponding to the arrangement shown in FIG. 2, it should be understood that this arrangement is intended to be illustrative and not limiting. It should be understood that, in one or more other embodiments, the extra lead 228 may instead by disposed between the carrier input lead 202 and the peaking input lead 204 (e.g., the arrangements shown in FIGS. 3-5), and may be connected to the RF cold point nodes 607 and 625 on the carrier output IPD 216 and the peaking output IPD 222, similarly to the arrangement shown in the present example.

Figure 7:
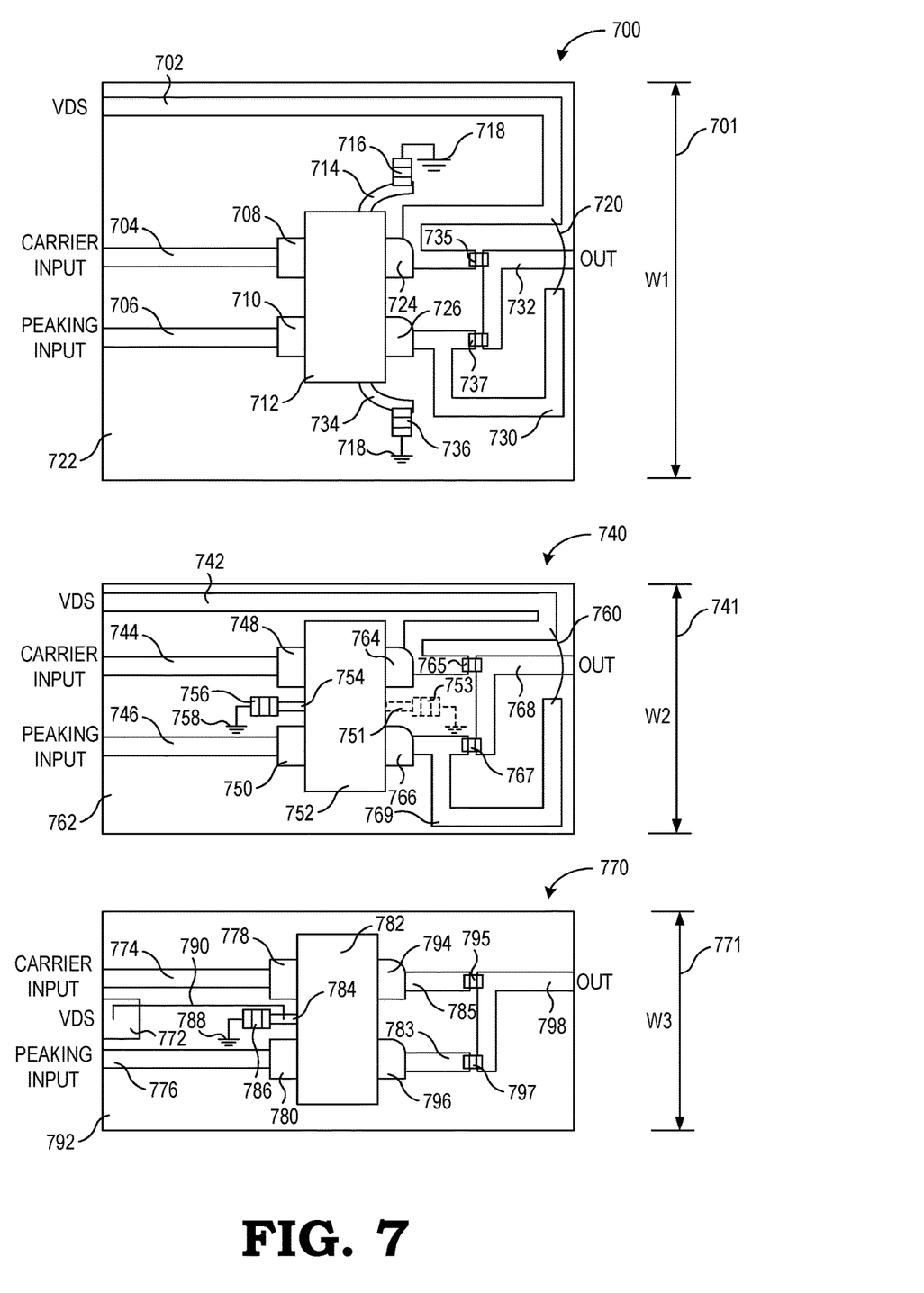
FIG. 7 is a diagram showing top-down views of various embodiments of device packages with respectively different widths and low frequency resonance decoupling arrangements, according to various embodiments.

FIG. 7 shows a first top-down view of a first Doherty amplifier device 700 that utilizes multiple extra leads for low frequency resonance decoupling, a second Doherty amplifier device 740 that includes a single extra lead for low frequency resonance decoupling, and a third Doherty amplifier device 770 that includes a single extra lead for low frequency resonance decoupling and drain voltage biasing. In the present example, respective widths 701, 741, 771 of the Doherty amplifier devices 700, 740, 770 are shown for purposes of comparison.

The first Doherty amplifier device 700 may include a substrate 722 on which various elements, including traces 702, 704, 706, 730, an output trace 732, and an amplifier package 712, are formed or otherwise disposed. The substrate 722 may have a width 701, W1.

The first Doherty amplifier device 700 includes an amplifier package 712, which may include various integrated passive devices, a carrier amplifier, and a peaking amplifier, as described in more detail above. The amplifier package 712 may include a carrier input lead 708 coupled to a conductive trace 704 that is configured to receive a carrier input signal. The amplifier package 712 may include a peaking input lead 710 coupled to a conductive trace 706 that is configured to receive a peaking input signal. The amplifier package 712 may include a carrier output lead 724 that is coupled to a conductive trace 702 configured to receive a drain bias voltage VDS from a drain bias voltage supply. The amplifier package 712 may include a peaking output lead 726 that is coupled to a conductive trace 730, which is coupled to the trace 702 via an air bridge 720, such that the drain bias voltage VDS is supplied to the peaking output lead 726 via the conductive trace 702, the air bridge 720, and the conductive trace 730. Additionally, the conductive trace 702 and the conductive trace 730 may each be coupled, via a capacitor 735 and a capacitor 737 respectively, to a conductive output trace 732. The conductive output trace 732 may be configured to combine a carrier output signal provided at the carrier output lead 724 and a peaking output signal provided at the peaking output lead 726 to form a combined output signal. The conductive output trace 732 may provide the combined output signal to an output of the first Doherty amplifier device 700.

The amplifier package 712 may include a first extra lead 714 and a second extra lead 734. The first extra lead 714 may be coupled between an RF cold point of impedance matching circuitry of the carrier path of the amplifier package 712 and a first decoupling capacitor 716. The first decoupling capacitor 716 may be coupled between the first extra lead 714 and a reference potential 718 (e.g., ground). The second extra lead 734 may be coupled between an RF cold point of impedance matching circuitry of the peaking path of the amplifier package 712 and a second decoupling capacitor 736. The second decoupling capacitor 736 may be coupled between the second extra lead 734 and the reference potential 718. The first extra lead 714 and the first decoupling capacitor 716 may be configured to provide low frequency resonance decoupling for the carrier path of the second Doherty amplifier device 740. The second extra lead 734 and the second decoupling capacitor 736 may be configured to provide low frequency resonance decoupling for the peaking path of the second Doherty amplifier device 740.

The second Doherty amplifier device 740 may include a substrate 762 on which various elements, including traces 742, 744, 746, 769, an output trace 768, and an amplifier package 752, are formed or otherwise disposed. In one or more embodiments, the substrate 762 may be formed from printed circuit board (PCB) material, such as Rogers 4350 as a non-limiting example. In one or more embodiments, the substrate 762 may be a multi-layer substrate that includes one or more layers of electrically insulating material and one or more layers of electrically conductive material. The substrate 762 may have a width 741, W2.

The second Doherty amplifier device 740 includes an amplifier package 752, which may include various integrated passive devices (e.g., the carrier input IPD 212, the peaking input IPD 218, the carrier output IPD 216, and the peaking output IPD 222 of FIGS. 2, 3, 5 and/or the IPD 538 of FIG. 5), a carrier amplifier (e.g., implemented on the carrier amplifier die 214 of FIGS. 2, 3, 5), and a peaking amplifier (e.g., implemented on the peaking amplifier die 220 of FIGS. 2, 3, 5), as described in more detail above. The amplifier package 752 may include a carrier input lead 748 coupled to a conductive trace 744 that is configured to receive a carrier input signal. The amplifier package 752 may include a peaking input lead 750 coupled to a conductive trace 746 that is configured to receive a peaking input signal. The amplifier package 752 may include a carrier output lead 764 that is coupled to a conductive trace 742 configured to receive a drain bias voltage VDS from a drain bias voltage supply. The amplifier package 752 may include a peaking output lead 766 that is coupled to a conductive trace 769, which is coupled to the trace 742 via an air bridge 760, such that the drain bias voltage VDS is supplied to the peaking output lead 766 via the conductive trace 742, the air bridge 760, and the conductive trace 769. Additionally, the conductive trace 742 and the conductive trace 769 may each be coupled, via a capacitor 765 and a capacitor 767 respectively, to a conductive output trace 768. The conductive output trace 768 may be configured to combine a carrier output signal provided at the carrier output lead 764 and a peaking output signal provided at the peaking output lead 766 to form a combined output signal. The conductive output trace 768 may provide the combined output signal to an output of the second Doherty amplifier device 740.

The amplifier package 752 may include a single extra lead 754 coupled between RF cold points (e.g., the RF cold point nodes 607, 625 of FIG. 6) of impedance matching circuitry of the carrier path and peaking path of the amplifier package 752 and a decoupling capacitor 756 (e.g., the decoupling capacitor 230 of FIGS. 2, 3, 5). The decoupling capacitor 756 may be coupled between the extra lead 754 and a reference potential 758 (e.g., ground). The extra lead 754 and the decoupling capacitor 756 may be configured to provide low frequency resonance decoupling for both the carrier path and the peaking path of the Doherty amplifier device 740. Because the second Doherty amplifier device 740 includes a single extra lead 754 for low frequency resonance decoupling for both the carrier path and peaking path, rather than two separate sets of extra leads and decoupling capacitors, the width 741 of the substrate 762 of the second Doherty amplifier device 740 may be (desirably) smaller than the width 701 of the substrate 722 of the first Doherty amplifier device 700. For example, the width 741 may be around 70% of the width 701.

While the extra lead 754 of the amplifier package 752 is implemented between the carrier input lead 748 and the peaking input lead 750 in the present example, it should be understood that in one or more other embodiments such an extra lead may instead be implemented at the outputs of the amplifier package 752. For example, in one or more such other embodiments, an extra lead 751 (e.g., the extra lead 228 of FIG. 2) and a decoupling capacitor 753 may be coupled in series between a reference potential (e.g., the reference potential 758) and RF cold points of the impedance matching circuitry of the carrier path and peaking path of the amplifier package 752, and the extra lead 754 and the decoupling capacitor 756 may be omitted.

The third Doherty amplifier device 770 may include a substrate 792 on which various elements, including traces 774, 776, 783, 785, an output trace 798, and an amplifier package 782, are formed or otherwise disposed. In one or more embodiments, the substrate 792 may be formed from printed circuit board (PCB) material, such as Rogers 4350 as a non-limiting example. In one or more embodiments, the substrate 792 may be a multi-layer substrate that includes one or more layers of electrically insulating material and one or more layers of electrically conductive material. The substrate 792 may have a width 771, W3.

The third Doherty amplifier device 770 includes an amplifier package 782, which may include various integrated passive devices (e.g., the carrier input IPD 212, the peaking input IPD 218, the carrier output IPD 216, and the peaking output IPD 222 of FIGS. 2-5 and/or the IPD 538 of FIG. 5), a carrier amplifier (e.g., implemented on the carrier amplifier die 214 of FIGS. 2-5), and a peaking amplifier (e.g., implemented on the peaking amplifier die 220 of FIGS. 2-5), as described in more detail above. The amplifier package 782 may include a carrier input lead 778 coupled to a conductive trace 774 that is configured to receive a carrier input signal. The amplifier package 782 may include a peaking input lead 780 coupled to a conductive trace 776 that is configured to receive a peaking input signal. The amplifier package 782 may include a carrier output lead 794 that is coupled to a conductive trace 785. The amplifier package 782 may include a peaking output lead 796 that is coupled to a conductive trace 783. The conductive trace 785 and the conductive trace 783 may each be coupled, via a capacitor 795 and a capacitor 797 respectively, to a conductive output trace 798. The conductive output trace 798 may be configured to combine a carrier output signal provided at the carrier output lead 794 and a peaking output signal provided at the peaking output lead 796 to form a combined output signal. The conductive output trace 798 may provide the combined output signal to an output of the third Doherty amplifier device 770.

The amplifier package 782 may include a single extra lead 784 coupled between RF cold points (e.g., the RF cold point nodes 607, 625 of FIG. 6) of impedance matching circuitry of the carrier path and peaking path of the amplifier package 782 and a decoupling capacitor 786 (e.g., the decoupling capacitor 230 of FIGS. 2-5). The decoupling capacitor 786 may be coupled between the extra lead 784 and a reference potential 788 (e.g., ground). The extra lead 784 and the decoupling capacitor 786 may be configured to provide low frequency resonance decoupling for both the carrier path and the peaking path of the third Doherty amplifier device 770.

The extra lead 784 may be used to provide a drain bias voltage VDS to the drains of the transistors of the carrier and peaking amplifiers of the amplifier package 782. For example, a drain bias voltage source (e.g., the drain bias voltage supply 434 of FIG. 4) may be coupled to a conductive trace 772. In some embodiments, an air bridge 790 may be coupled between the conductive trace 772 and the extra lead 784, such that the drain bias voltage source may supply the drain bias voltage VDS to the amplifier package 782 via the conductive trace 772, the air bridge 790, and the extra lead 784. In one or more other embodiments, an additional conductive trace may be used to couple the conductive trace 772 to the extra lead 784, instead of or in addition to the air bridge 790. Supplying the drain bias voltage VDS via the extra lead 784 in this way may require less space than that other approaches in which the drain bias voltage VDS is provided to the carrier output lead 794 and the peaking output lead 796 through two separate conductive traces.

Because the third Doherty amplifier device 770 omits separate conductive traces (e.g., conductive traces 702, 730 of the first Doherty amplifier device 700) for supplying VDS to the amplifier package 782 and because the third Doherty amplifier device 770 includes a single extra lead 784 for low frequency resonance decoupling for both the carrier path and peaking path, the width 771 of the substrate 792 of the third Doherty amplifier device 770 may be (desirably) smaller than the width 701 of the substrate 722 of the first Doherty amplifier device 700. For example, the width 771 may be around 60% of the width 701. In one or more embodiments, the width 701 may be around 42 mm, the width 741 may be around 29 mm, and the width 771 may be around 25 mm.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one embodiment has been presented in the foregoing detailed description, it should be appreciated numerous acceptable variations are possible. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier device comprising:
   a first amplification path that includes first impedance matching circuitry implemented on a first integrated passive device die, a first input lead, a first output lead, and a first amplifier die, wherein the first integrated passive device die is disposed directly between the first amplifier die and the first output lead;
   a second amplification path that includes second impedance matching circuitry implemented on a second integrated passive device die, a second input lead, a second output lead, and a second amplifier die, wherein the second integrated passive device die is disposed directly between the second amplifier die and the second output lead;
   a decoupling capacitor coupled to a reference potential, wherein the decoupling capacitor is configured to decouple low frequency resonances; and
   a conductive lead that is connected to the first integrated passive device die via a first wire bond and that is connected to the second integrated passive device die via a second wire bond, wherein the decoupling capacitor is attached to the conductive lead, is coupled to the first impedance matching circuitry via the conductive lead and the first wire bond, and is coupled to the second impedance matching circuitry via the conductive lead and the second wire bond.

2. The amplifier device of claim 1, wherein the decoupling capacitor is configured to decouple low frequency resonances in a frequency range of 10 MHz to 100 MHz.

3. The amplifier device of claim 1, wherein the conductive lead is coupled to a first RF cold point node of the first impedance matching circuitry and to a second RF cold point node of the second impedance matching circuitry.

4. The amplifier device of claim 2, wherein the first input lead is configured to receive a first input signal, the second input lead is configured to receive a second input signal, the first output lead is configured to provide a first output signal, and the second output lead is configured to provide a second output signal.

5. Wherein the conductive lead is disposed between the first output lead and the second output lead.

6. The amplifier device of claim 4, wherein the conductive lead is disposed between the first input lead and the second input lead.

7. The amplifier device of claim 6, further comprising:
   a voltage supply coupled to the conductive lead, wherein the voltage supply is configured to supply a bias voltage to transistors of each of the first amplifier die and the second amplifier die.

8. The amplifier device of claim 6, further comprising:
   an additional integrated passive device die disposed between the first amplifier die and the second amplifier die, wherein the additional integrated passive device die comprises:
   at least one conductive pad, wherein the conductive lead is coupled to the first impedance matching circuitry and the second impedance matching circuitry via the at least one conductive pad; and
   a wire fence coupled to the at least one conductive pad and comprising a plurality of wire bond loops, wherein the wire fence is configured to mitigate RF interference between the first amplifier die and the second amplifier die.

9. A Doherty amplifier device comprising:
a carrier amplification path that includes first impedance matching circuitry implemented on a first integrated passive device die, a carrier input lead, a carrier output lead, and a carrier amplifier die, wherein the first integrated passive device die is disposed directly between the carrier amplifier die and the carrier output lead;
a peaking amplification path that includes second impedance matching circuitry implemented on a second integrated passive device die, a peaking input lead, a peaking output lead, and a peaking amplifier die, wherein the second integrated passive device die is disposed directly between the peaking amplifier die and the peaking output lead;
a conductive lead that is coupled to a first RF cold point of the first impedance matching circuitry via a first wire bond that is connected to the first integrated passive device die and that is coupled to a second RF cold point of the second impedance matching circuitry via a second wire bond that is connected to the second integrated passive device die; and
a decoupling capacitor coupled between the conductive lead and a reference potential, wherein the decoupling capacitor is configured to decouple low frequency resonances.

10. The Doherty amplifier device of claim 9, wherein the decoupling capacitor is configured to decouple low frequency resonances in a frequency range of 10 MHz to 100 MHz.

11. The Doherty amplifier device of claim 9, wherein decoupling capacitor has a capacitance of between 1 µF and 10 µF.

12. The Doherty amplifier device of claim 10, wherein the carrier input lead is configured to receive a carrier input signal, peaking input lead is configured to receive a peaking input signal, the carrier output lead is configured to provide a carrier output signal, and the peaking output lead is configured to provide a peaking output signal.

13. The Doherty amplifier device of claim 12, wherein the conductive lead is disposed between the carrier output lead and the peaking output lead.

14. The Doherty amplifier device of claim 12, wherein the conductive lead is disposed between the carrier input lead and the peaking input lead.

15. The Doherty amplifier device of claim 14, further comprising:
a voltage supply coupled to the conductive lead, wherein the voltage supply is configured to supply a bias voltage to transistors of each of the carrier amplifier die and the peaking amplifier die.

16. The Doherty amplifier device of claim 14, further comprising:
an additional integrated passive device die disposed between the carrier amplifier die and the peaking amplifier die, wherein the additional integrated passive device die comprises:
at least one conductive pad, wherein the conductive lead is coupled to the first impedance matching circuitry and the second impedance matching circuitry via the at least one conductive pad; and
a wire fence coupled to the at least one conductive pad and comprising a plurality of wire bond loops, wherein the wire fence is configured to mitigate RF interference between the carrier amplifier die and the peaking amplifier die.

* * * * *